United States Patent
Geen

(10) Patent No.: US 7,956,783 B2
(45) Date of Patent: Jun. 7, 2011

(54) ANALOG-TO-DIGITAL CONVERTER USING DIGITAL OUTPUT AS DITHER

(75) Inventor: John A. Geen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 20 days.

(21) Appl. No.: 12/478,936

(22) Filed: Jun. 5, 2009

(65) Prior Publication Data

US 2010/0188274 A1   Jul. 29, 2010

Related U.S. Application Data

(60) Provisional application No. 61/148,210, filed on Jan. 29, 2009.

(51) Int. Cl.
*H03M 3/00* (2006.01)
(52) U.S. Cl. ..................................... 341/143; 375/247
(58) Field of Classification Search .......... 341/143–155; 375/247, 36, 245
See application file for complete search history.

(56) References Cited

U.S. PATENT DOCUMENTS

| | | | | |
|---|---|---|---|---|
| 4,922,750 A * | 5/1990 | Magori | ..................... | 73/114.32 |
| 4,922,756 A | 5/1990 | Henrion | ..................... | 73/517 |
| 5,144,308 A * | 9/1992 | Norsworthy | ..................... | 341/131 |
| 5,357,252 A * | 10/1994 | Ledzius et al. | ..................... | 341/143 |
| 5,777,512 A * | 7/1998 | Tripathi et al. | ..................... | 56/283 |
| 5,974,089 A * | 10/1999 | Tripathi et al. | ..................... | 375/247 |
| 6,386,032 B1 * | 5/2002 | Lemkin et al. | ..................... | 73/504.02 |
| 6,470,748 B1 | 10/2002 | Geen | ..................... | 73/540.12 |
| 6,825,784 B1 | 11/2004 | Zhang | ..................... | 341/131 |
| 6,839,387 B1 * | 1/2005 | Mittel | ..................... | 375/247 |
| 7,005,987 B2 * | 2/2006 | Sinnett et al. | ..................... | 340/572.1 |

FOREIGN PATENT DOCUMENTS

GB          2127637          4/1984

* cited by examiner

*Primary Examiner* — Lam T Mai
(74) *Attorney, Agent, or Firm* — Sunstein Kann Murphy & Timbers LLP

(57) ABSTRACT

An analog-to-digital converter includes a delta circuit, a sigma circuit, and a quantizer circuit and further includes a feedback circuit that modulates a reference voltage provided to the quantizer circuit based on the quantizer circuit output. Modulation of the quantizer reference voltage dithers the quantizer circuit to effectively reduce or avoid lock bands. The analog-to-digital converter may be used in combination with a microelectromechanical (MEMS) device such as a gyroscope, an accelerometer, or a pressure sensor.

19 Claims, 8 Drawing Sheets

ANALOG-TO-DIGITAL CONVERTER USING DIGITAL OUTPUT AS DITHER

CROSS-REFERENCE TO RELATED APPLICATION

This application claims the benefit of U.S. Provisional Patent Application No. 61/148,210, entitled ANALOG-TO-DIGITAL CONVERTER USING DIGITAL OUTPUT AS DITHER, filed on Jan. 29, 2009, which is hereby incorporated herein by reference in its entirety.

TECHNICAL FIELD

The present invention relates to systems having transducers for converting analog signals to digital signals, and more particularly to micromachined analog-to-digital converter systems using their digital outputs as a source of quantization dither.

DESCRIPTION OF RELATED ART

In today's information age, analog-to-digital converter (ADC) devices are often used for converting analog signals into digital signals for use in electronic systems. For example, in order to store audible sound as a music file, a pressure sensor such as a microphone may be used to convert sound waves into an analog voltage signal that is then converted into ones and zeros by an analog-to-digital converter. Those ones and zeros are then compressed and formatted into a music file. At a later time, the music can be played back on a speaker by reversing this process. ADCs are used in many other applications, such as measuring acceleration for an automobile airbag system with an accelerometer, measuring spatial orientation in a video game controller with a gyroscope, measuring temperature in an electronic thermostat with a thermocouple, and measuring brightness in a night light with a photodetector, to name but a few.

Many ADCs use a technique known as delta-sigma modulation (sometimes alternatively referred to as sigma-delta modulation) to convert analog input signals to digital output signals. Generally speaking, delta-sigma modulation works as follows. First, the analog input signal is combined with a feedback signal to produce a difference (delta) signal, which is passed to an integrator that outputs a sum (sigma) of the difference signals over time. Until the sum reaches a predetermined threshold, a logic zero (0) is output. When the threshold is reached, a logic one (1) is output. The feedback signal is driven by the output voltage to 'reset' the sum when a logic one is output. In this way, if the analog input signal is large, the threshold will be reached more quickly, and more ones will be output. On the other hand, if the analog signal is small, the threshold will take longer to reach, and more zeros will be output. The ratio between ones and zeros in the output reflects the average value of the analog signal over time, with the ratio becoming more precise over longer periods of time. Logic values zero and one are represented by different voltages. For example, logic one may be a positive voltage while logic zero is zero volts, or logic one may be a voltage V and logic zero may be a matched voltage −V.

FIG. 1 is a schematic block diagram of an exemplary delta-sigma modulator as is known in the art. The modulator converts an analog input 110 into a digital output 160. A difference element (delta) 120 subtracts a feedback signal 171 (described below) from the input 110 to produce a difference signal 121, as will be described in more detail shortly. A summing element (sigma) 130 produces a sum signal 131 from the difference signals 121.

A quantizer element 140, also referred to herein as a comparator, compares the sum signals 131 from the summing element 130 (at the terminal marked "+") to a reference voltage 142 (at the terminal marked "−"). The reference voltage $V_{ref}$ may be, for example, 0V (electrical ground) or another fixed reference voltage. If the signals 131 are greater than the reference voltage, then the output 141 of the quantizer element 140 is a logic one (represented by box 146), while if the signals are not greater than the reference voltage, the output 141 of the quantizer element 140 is a logic zero (represented by box 144). The boxes numbered 144 and 146 represent the two output logical voltages produced by the quantizer 140, and are not necessarily input voltages provided as inputs to the quantizer 140.

Output voltage 141 is stored in a memory device, here depicted as a D-type latch element 150. The memory device is clocked so that it can interface with other electrical systems that run on a clock, such as computers. Thus, the memory device only stores voltage 141 at certain times, such as the edge of a clock pulse defined by a clock signal 152. The stored voltage is output at the terminal marked "Q" as digital output 160.

Digital output 160 is fed back to the difference element 120 through a digital-to-analog converter (D/A) element 170, which produces the feedback signal 171 mentioned above. When the digital output is a logic one (1), D/A element 170 outputs a voltage $V_{DA}$ (represented by box 172), so that $V_{DA}$ volts are effectively subtracted from the analog input 110 by difference element 120. When the digital output 160 is a logic zero (0), D/A element 170 outputs a matched negative voltage $-V_{DA}$ volts (represented by box 174), so that $V_{DA}$ volts are effectively added to the analog input 110 by the difference element 120. The voltages within the difference element 120, summing element 130, and the signals 131 may remain within required electrical tolerances by choosing appropriate matched outputs of D/A element 170. Elements 120, 130, and 140 are typically implemented using operational amplifiers. The purpose of dither generator 180 is explained below.

Delta-sigma modulation may be used to provide a digital output from servomechanisms (e.g., micromachined accelerometers, gyroscopes, and other sensors) having analog error signals. A useful property of the pulse-density modulated output is that it has an analog time average directly proportional to the input signal and can be used as feedback without explicit digital to analog conversion. Another useful property for vibratory gyroscopes is that the modulation with the shuttle frequency can be achieved with minimal circuits as a cross switch or exclusive-or function. The use of delta-sigma modulation with micromachined sensors has been described by Henrion in U.S. Pat. No. 4,922,756.

However, mechanical sensors generally have inherent signal delays due to the inertial effects of masses changing direction and speed. These delays can cause difficulties with lower frequency limit-cycle oscillations in delta-sigma loops containing them. These oscillations generally occur at low frequencies other than those normally determined by the input signal. These limit-cycle oscillations may appear as undesirable 'tones'. These tones tend to increase noise in measuring instruments and, by their persistence, tend to cause output "locking" around various input values, most notably around null. When an instrument is locked, it generates long sequences of zeros or ones, allowing the output voltage to stabilize over relatively long durations. When this occurs, feedback mechanisms such as the feedback loop including D/A element 170 may not work properly. This locking therefore tends to reduce a measuring instrument's response to changes in its input, reducing the resolution and linearity of the instrument.

Some advantages of using well-matched drive and feedback elements in micromachined gyroscopes with delta-sigma feedback is taught by Geen in U.S. Pat. No. 6,470,748. Practical implementation is facilitated by exploiting a degree of resonance enhancement to the signal in the Coriolis accelerometer. However, the effective mechanical lag is also increased in proportion to the signal gain so that the difficulties with unwanted delta-sigma limit-cycles can become more severe.

There are several prior-art approaches to solving this locking problem using modified delta-sigma feedback loops. In one approach, the mechanical lag is compensated with an electrical lead forming a match-filter. This approach is described by Geen in U.K. Patent 2,127,637. However, lag may vary considerably between instrument specimens, requiring individual adjustment which may be impractical in mass production.

A second approach (often used in audio applications) uses multistage modulators as, for example, described by Ledzius et al. in U.S. Pat. No. 5,357,252. Having multiple delta-sigma stages, however, introduces impractical complexities in present manufacturing processes integrating mechanical structures with electronics. In particular, the variability of the sensors and their signal gains generally make it very difficult to devise a stable configuration for a higher order delta-sigma modulator.

A third approach applies a dither signal large enough to randomize the locking behavior. Dither is essentially random noise having an average of zero. By adding this noise, a long string of output zeros or ones may be broken up, while still maintaining the same long-term average output signal. Dither is represented in FIG. 1 by dither generator 180, which provides an additive signal to the quantizer 140. The use of dither in a multistage delta-sigma modulator is described by Norsworthy in U.S. Pat. No. 5,144,308, and is applied to micromachined sensors by Lemkin et al. in U.S. Pat. No. 6,386,032.

The generation of a dither signal 180 having sufficient randomness and amplitude generally requires significant circuitry and can consume a substantial proportion of the available signal headroom. In U.S. Pat. No. 6,839,387, Mittel teaches a more economical method of self-dithering a delta-sigma modulator by inserting D-type delays into the loop. However, doing so still utilizes dozens of transistors, and the delays are likely to worsen the difficulties associated with mechanical elements. Zhang uses a pseudo-random dither generator to modulate the threshold windows of a multi-level comparator in U.S. Pat. No. 6,825,784. This circuit is relatively complex and correspondingly expensive, but has the advantage of not consuming much signal headroom.

BRIEF SUMMARY OF THE INVENTION

Embodiments of the present invention address the locking issue discussed above by placing a proportional feedback around the comparator (quantizer element) to modulate the comparator reference voltage based on the comparator output. This proportional feedback may be implemented using as little as one transistor or resistor. In essence, this proportional feedback is a self-dithering mechanism that does not consume signal headroom and that requires little added circuitry and therefore little added cost, particularly in integrated micromachining processes. Because the proportional feedback is independent of the analog input signal, it may be used in delta-sigma modulators generally, so embodiments of the invention are not limited to use with micromachined sensors but may also be used in audio, telecommunications, and other applications.

In a first embodiment of the invention there is provided apparatus comprising an analog-to-digital converter for converting an analog input signal to a digital output signal. Generally speaking, the converter has four main components, namely a delta circuit, a sigma circuit, a quantizer circuit, and a feedback circuit. The delta circuit produces a delta output signal based on the analog input signal and an analog feedback signal derived from the digital output signal. The sigma circuit integrates the delta output signal to form a sigma output signal. The quantizer circuit produces the digital output signal based on the sigma output signal and a reference signal. Finally, the feedback circuit modulates the reference signal based on the digital output signal.

The feedback circuit may include a transistor, a voltage divider, or a voltage amplifier. The quantizer circuit may include a comparator having an output and a digital memory coupled to the comparator output. If so, the digital memory may be a latch, and may store a digital output voltage. The delta circuit may include a digital-to-analog converter for producing the analog feedback signal based on the digital output signal.

A related embodiment may further include a microelectromechanical sensor having a mechanical-to-electrical transducer for providing the analog input signal to the analog-to-digital converter based on mechanical operation of the sensor. In this embodiment, the sensor may be, for example, a gyroscope, an accelerometer, or a pressure sensor. A related embodiment may also include an electrical-to-mechanical transducer for producing a mechanical effect on the sensor based on the digital output signal.

In another embodiment of the invention there is provided a method for dithering an analog-to-digital converter apparatus having a quantizer for comparing a quantizer input voltage to a reference voltage, the quantizer having an output voltage. The method includes two processes: storing the quantizer output voltage in a digital memory, and varying the reference voltage based on the stored output voltage.

Storing the output voltage may include providing the output voltage to a latch, or converting the output voltage substantially into one of two given voltages. The reference voltage may equal the stored output voltage, so that converting the stored output voltage into the reference voltage requires no active or passive circuit elements. Varying the reference voltage based on the stored output voltage may include applying a constant gain to the stored output voltage.

In a related embodiment, the analog-to-digital transducer apparatus includes a microelectromechanical sensor having an analog output. The sensor may be one of: a gyroscope, an accelerometer, and a pressure sensor. In this embodiment, the method may further include determining the quantizer input voltage based on the analog output of the sensor. The method may include actuating the sensor in response to a change in the stored output voltage. In a related embodiment wherein the sensor has a resonance frequency, varying the reference voltage may include varying it according to a clock frequency that is at least a given multiple of the resonance frequency.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

Definitions. As used in this description and the accompanying claims, the following terms shall have the meanings indicated, unless the context otherwise requires:

An analog-to-digital converter (ADC) is an electrical circuit that converts a continuous, analog signal into a representative, discrete, digital signal. The analog signal is commonly an electric potential having a continuous range of voltage, while the digital signal is commonly a stream of logical binary (zero or one) values, each value embodied as one of two given voltages.

Headroom is the amount by which the values representable by a digital output signal (digital full scale) exceed the range of expected input values (analog full scale). Systems having insufficient headroom may suffer from clipping, where an input signal has a value so large that it exceeds the ability of the digital output signal to represent it. Clipping causes a loss of signal information.

Quantization noise is analog error that is introduced in the process of quantizing a signal, i.e., converting a signal from continuous to discrete in an ADC. The error arises because the finite number of values a discrete output signal may have cannot represent all of the values a continuous input signal may have. Quantization noise manifests itself as undesirable frequencies in the digital signal.

Dither is a signal applied to randomize the frequencies of quantization noise in an ADC, thereby reducing or preventing the appearance of tones in the digital signal. Applying an additive dither signal to an analog signal already at an extremum of its signal range results in an input signal exceeding that range, thus decreasing the available headroom. If the dither signal is too large, clipping will result. However, if the dither signal is too small, undesirable quantization noise may still appear in the digital output.

A delta-sigma modulator (sometimes known as a sigma-delta modulator) is an analog-to-digital converter that includes, among other things, a differencing element (delta) and an integrating element (sigma). The modulator integrates the input signal over time, and generates an output signal based on the value of the integrated signal. When the integrated signal is below a given threshold, the modulator outputs a logic zero. When the integrated signal exceeds the threshold, the modulator outputs a logic one, and the threshold value is subtracted from the integrated signal.

Figure 1:
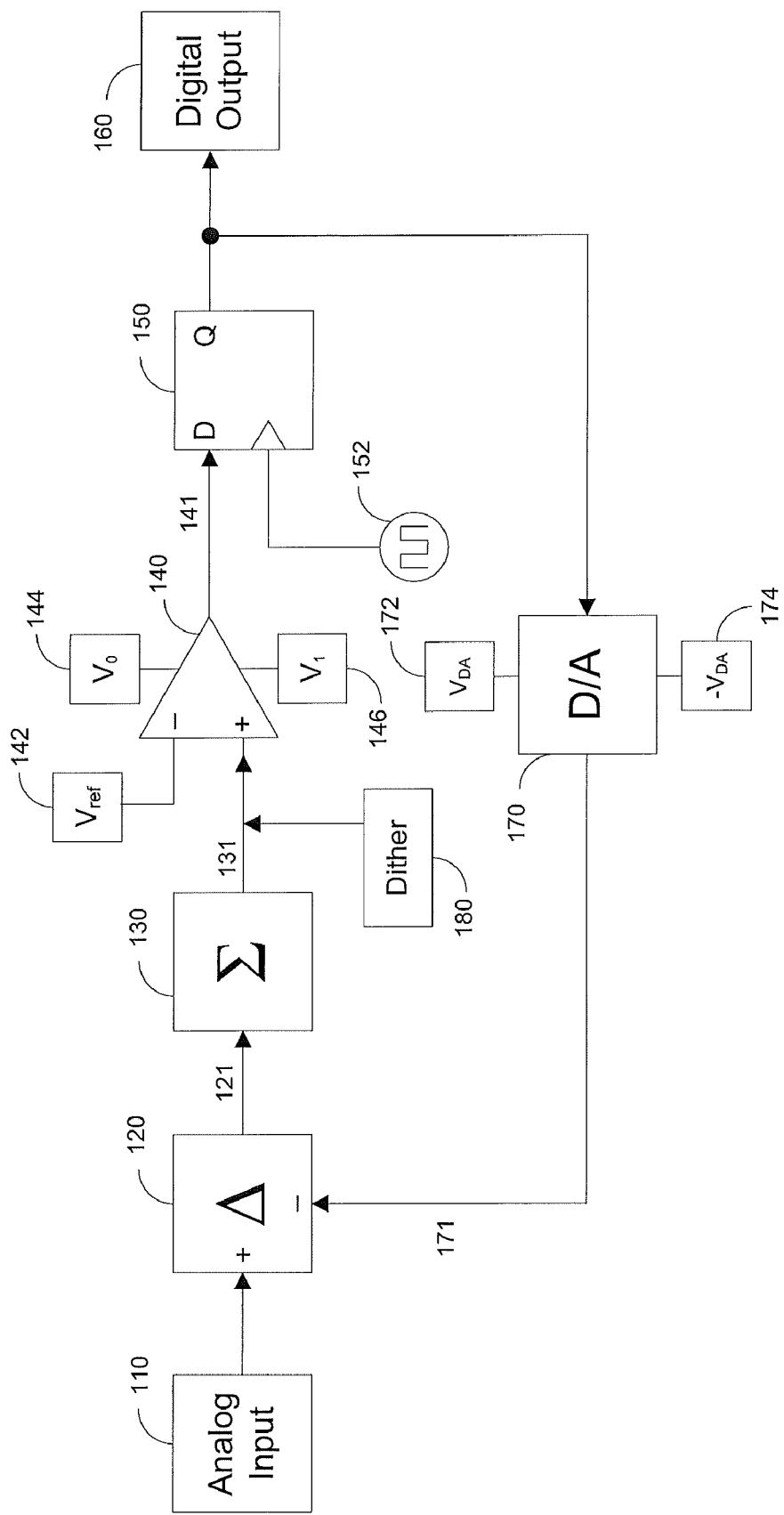
FIG. 1 is a schematic block diagram of a delta-sigma circuit, as is known in the art.
Figure 2:
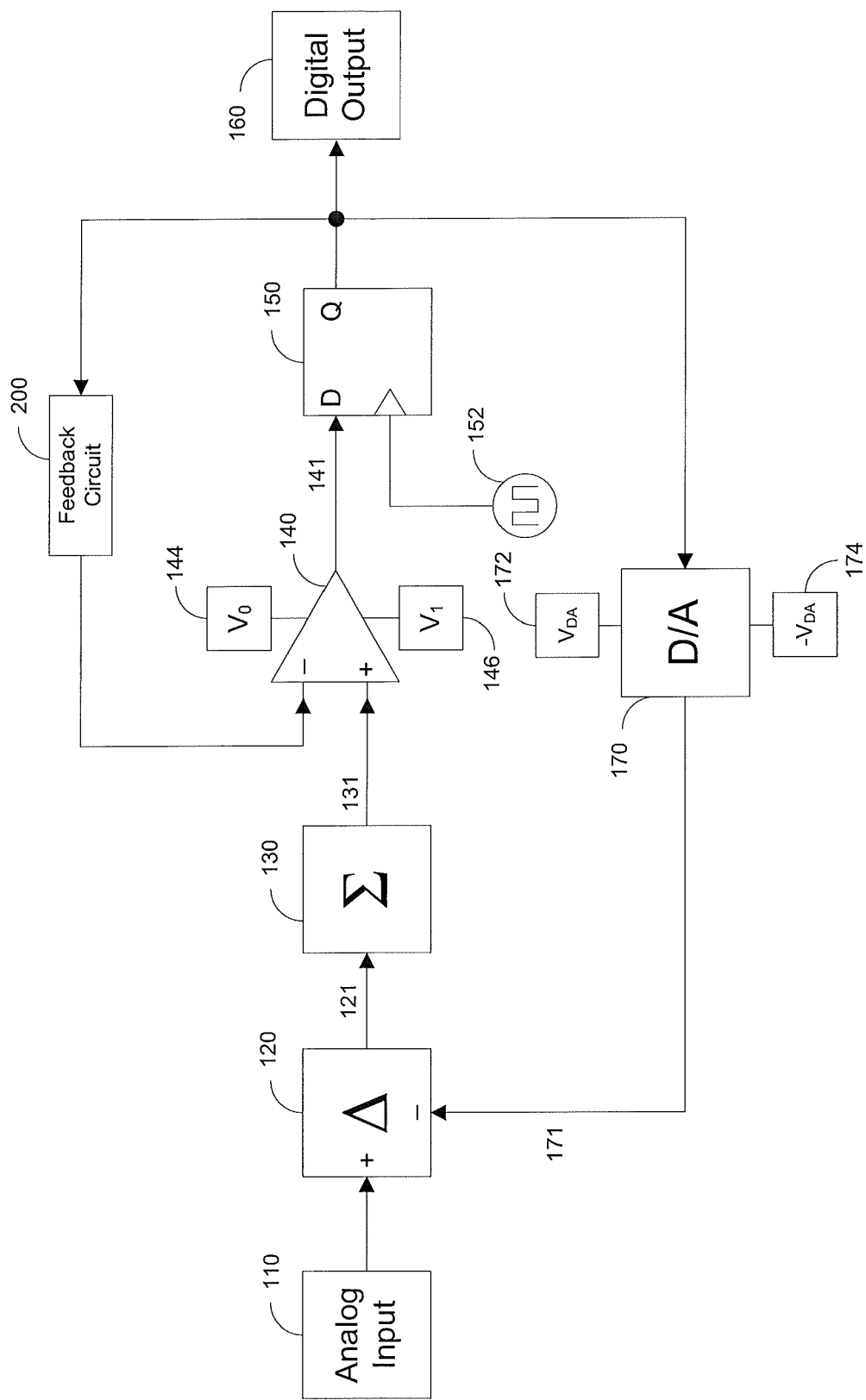
FIG. 2 is a schematic block diagram of a delta-sigma modulator in accordance with an embodiment of the present invention.

FIG. 2 is a schematic block diagram of a delta-sigma modulator in accordance with an exemplary embodiment of the present invention. This delta-sigma modulator operates similar to the delta-sigma modulator of FIG. 1, but in this exemplary embodiment a feedback circuit 200 is used to modulate the reference voltage provided to the quantizer 140 at the terminal marked '−' based on the output of the quantizer 140. Specifically, in this embodiment, the feedback circuit 200 modulates the reference voltage of the quantizer 140 based on the output of the latch 150, which itself is based on the quantizer 140 output. The feedback circuit 200 may include as little as a single resistor or transistor, or may include a voltage divider or voltage amplifier providing a fixed or varying gain. In essence, the feedback circuit 200 provides a self-dithering mechanism. The feedback circuit does not consume signal headroom, because its output does not appear in the analog input signal. Further, the feedback circuit may require little added circuitry and therefore little added cost, both of which are particularly important in integrated micromachining processes.

The feedback circuit 200 generally operates as follows. Rather than adding dither at the '+' terminal of quantizer 140 using dither generator 180 as in FIG. 1, the feedback circuit 200 modulates the reference voltage at the '−' terminal of quantizer 140 based on the quantizer 140 output, and more specifically based on the latch 150 output. For example, increasing the quantizer 140 reference voltage by V volts requires the '+' signal to increase by V additional volts in order to register an output value of logic one. Similarly, decreasing the quantizer 140 reference voltage by V volts requires the '+' signal to increase by V fewer volts in order to register an output value of logic one.

Figure 3:
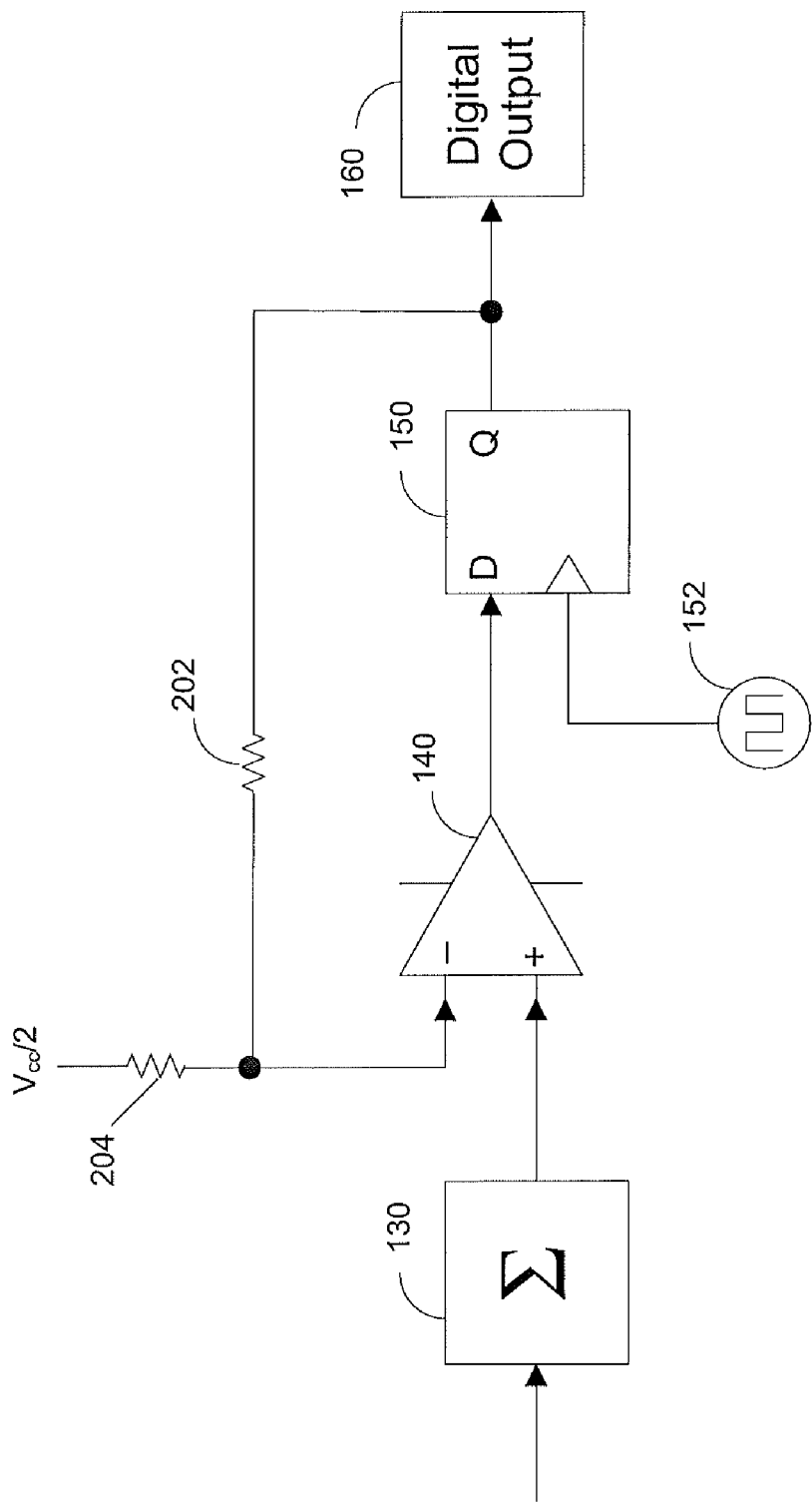
FIG. 3 is a schematic block diagram of a simple feedback circuit for the delta-sigma modulator of FIG. 2, in accordance with an exemplary embodiment of the present invention.

FIG. 3 is a schematic block diagram of a simple feedback circuit for the delta-sigma modulator of FIG. 2, in accordance with an exemplary embodiment of the present invention. In this exemplary embodiment, in which several components are omitted from the figure for clarity, the feedback circuit 200 is arranged as a simple resistive voltage divider. In this arrangement, a single resistor 202 is situated between the output of latch 150 and a connection 204 (which, in this exemplary embodiment, is referenced at a voltage $V_{cc}/2$). In alternative embodiments, the resistor 202 could be replaced with a capacitor, transistor, another single circuit element, or more complex circuitry.

Figure 4:
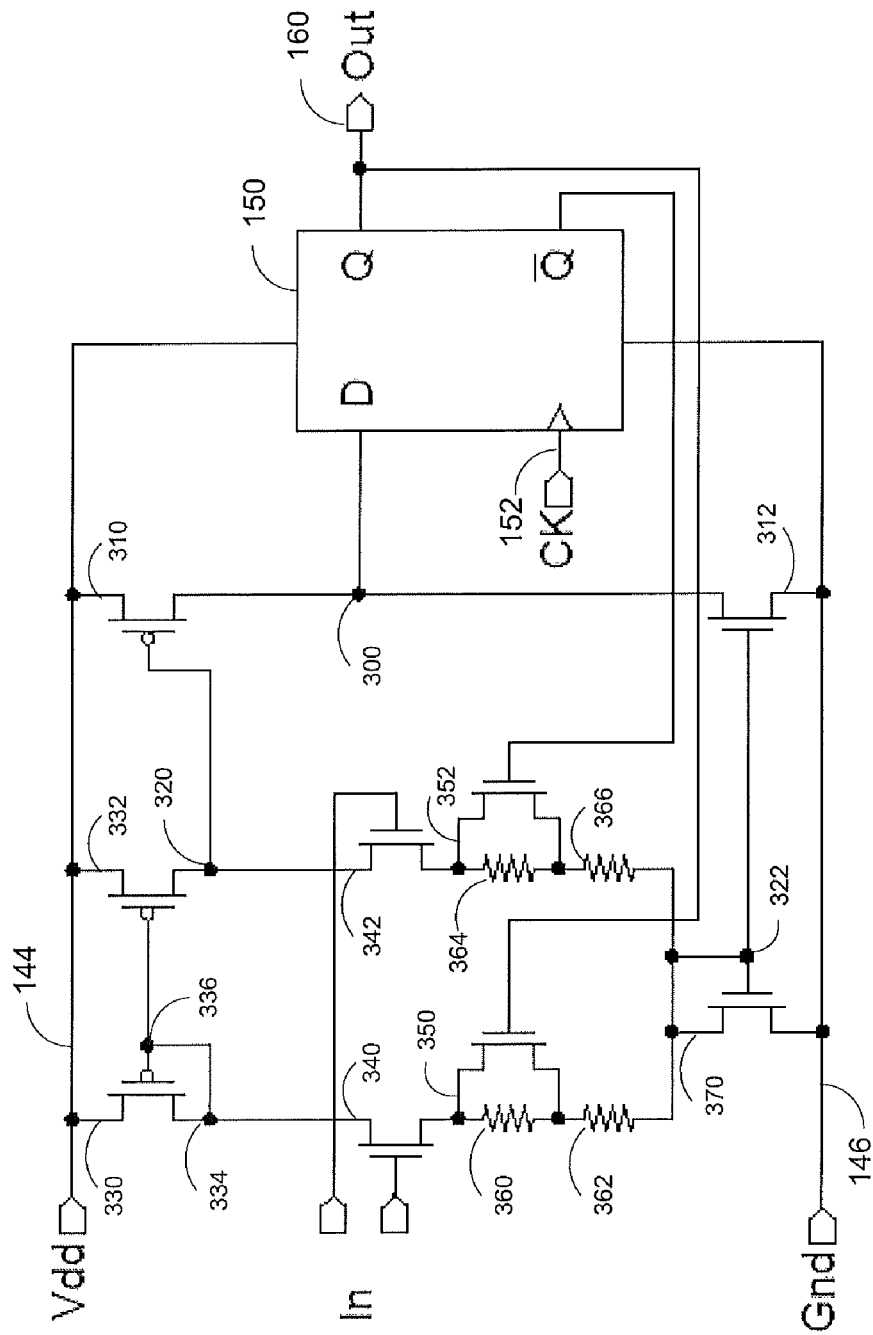
FIG. 4 is a schematic diagram of one exemplary embodiment of the quantizing stage of the delta-sigma modulator of FIG. 2.

FIG. 4 is a schematic diagram of one exemplary embodiment of the quantizing stage (encompassing the quantizer 140, the latch 150, and the feedback circuit 200) of the delta-sigma modulator of FIG. 2. In one embodiment, the digital output of latch 150 is either +5V (logic 1) or 0V (logic 0), but it will be understood that other output voltages may be employed in accordance with other embodiments. The depicted quantizing stage incorporates a balanced quantizer (comparator) configuration with differential inputs, where resistors 362, 366 provide the common-mode voltage. The circuit works generally as follows.

The digital output value 160 of the circuit is determined by the voltage at node 300. If this voltage is large enough when clock signal 152 reaches an edge, the latch 150 will store a logic one (1), which will be presented at the output 160. If the voltage is too small, the latch 150 will store a logic zero (0) and present this value at the output 160.

The voltage at node 300 is controlled by transistors 310, 312. Transistor 310 connects node 300 with voltage $V_{dd}$ 144, while transistor 312 connects node 300 with ground voltage 146. The current through transistor 310 must equal the current through transistor 312, by Kirchoff's current law. Generally, however, one of the transistors 310, 312 will limit the current that passes through both. If transistor 310 is the current limiter, then the voltage at node 300 will tend to the ground voltage 146, while if transistor 312 is the current limiter, the voltage at node 300 will tend to $V_{dd}$ 144. The currents through transistors 310, 312 are determined, in turn, by the voltages at nodes 320, 322 respectively.

The left half of the circuit is divided into two limbs, with node 320 in the right limb and node 322 common to both limbs. The left limb extends between transistor 330 and transistor 370. The right limb extends between transistor 332 and transistor 370. Transistor 330 is configured as a diode-connected current source. Because transistors 330, 332 share a gate voltage, the current in the left and right limbs is mirrored. Transistor 370 is configured as a diode-connected current drain for both limbs, and shares its gate voltage with transistor 312. The current in both limbs is controlled by transistors 340, 342, whose respective gate voltages are controlled by the differential input signal. Whichever transistor 340, 342 has a lower gate voltage acts to limit the current passing through both limbs.

The voltage at node 320 is determined by whichever of the transistors 340, 342 is the current-limiting transistor. If transistor 340 has the lower gate voltage, it limits the current through the limbs, and the voltage at node 320 will tend to ground voltage 146. This in turn will increase the conductance of transistor 310, which has an inverted gate. On the other hand, if transistor 342 has a lower gate voltage, then the voltage at node 320 will tend to $V_{dd}$ 144. This will decrease the conductance of transistor 310. The difference between the gate voltages of transistors 340, 342 need only be slight for the above effects to occur. Thus, the circuit as described so far acts as a voltage comparator or single-bit quantizer, as is well known in the art.

In accordance with embodiments of the invention, the quantizing stage is modified by a feedback circuit 200, consisting of transistors 350, 352 and resistors 360, 364. The digital output 160, which provides the gate voltages for transistors 350, 352, thus controls the operation of the quantizing stage. If the value of digital output 160 is a logic zero (0), then transistor 350 does not conduct between its source and drain, so the left limb includes both resistors 360, 362. At the same time, a logic one (1) is presented to the gate of transistor 352, which conducts. The right limb thus includes only resistor 366 and not resistor 364, which is short-circuited.

Because the currents in the left and right limbs are balanced, the additional resistance in the left limb provides a voltage offset. The voltage at the drain of transistor 340 is higher than the voltage at the drain of transistor 342 by the size of this offset. Thus, to maintain the same gate-drain voltage in transistor 340, the gate voltage must increase by this offset. Because the input is differential, this in turn requires the input signal to be larger than the induced offset. If the magnitude of the input is smaller than the offset, then the voltage at node 320 will drop to ground and the voltage at node 300 will increase. Thus at the next clock cycle, the latch will store a logic one (1), changing state.

Conversely, if the value of output 160 is a logic one (1), then transistor 350 conducts and transistor 352 does not conduct. In this configuration, the left limb includes only resistor 362 and not resistor 360, and the right limb includes both resistors 364, 366. The right limb thus contains a voltage offset, and the input signal must again exceed the voltage offset (with opposite sign) to maintain the ground voltage at node 320. If the magnitude of the input is smaller than the offset, then the voltage at node 320 will increase, and the voltage at node 300 will decrease. Thus at the next clock cycle, the latch will store a logic zero (0), changing state.

Combining these two cases, it can be seen that if the input signal remains small in either positive or negative magnitude, the latch will change state between logic one (1) and logic zero (0) each clock cycle. As a result, the feedback circuit 200 of the embodiment shown in FIG. 4 essentially forces a quiescent oscillation having frequency equal to half that of clock 152, that can be regarded as "dither" to smear lock bands that may appear in the output at frequency CK/2N. Unlike the dither represented in FIG. 1, however, this "dither" is not additive and does not consume headroom. The size of the input signal that avoids this effect is controlled by the voltage offset, which in turn is controlled by the resistors 360, 364.

It is possible to simplify the circuit even further, while retaining its essential properties. For example, a voltage offset may be induced by omitting transistor 352 and resistor 364, and fixing the resistance $R_{366}$ of resistor 366 to be between that of the high and low resistances that appear on the left limb during operation of the circuit. These high and low resistances are given by $R_{362}+R_{360}$ (when transistor 350 does not conduct) and $R_{362}$ (when transistor 350 conducts), respectively. In one particularly useful embodiment of this technique, resistor 366 has a resistance equal to the average of these, or $R_{362}+0.5\,R_{360}$.

With these values for resistors 360, 362, and 366, when the output 160 is logic one (1), transistor 350 conducts and the left limb has less resistance than the right limb. When the output 160 is logic zero (0), transistor 350 does not conduct and the left limb has greater resistance than the right limb. The feedback circuit 200 thus operates according to the basic principle described above, but employs fewer components. In another embodiment, resistor 366 does not have an average resistance, and the voltage band in which dithering occurs is no longer centered on the common mode voltage.

Numerous variations on this basic principle are contemplated. For example, digital memory 150 may be implemented using other digital logic. The feedback loop may be implemented with electrical components other than transistors, and the tipping may be accomplished by, e.g., capacitors rather than resistors.

Figure 5:
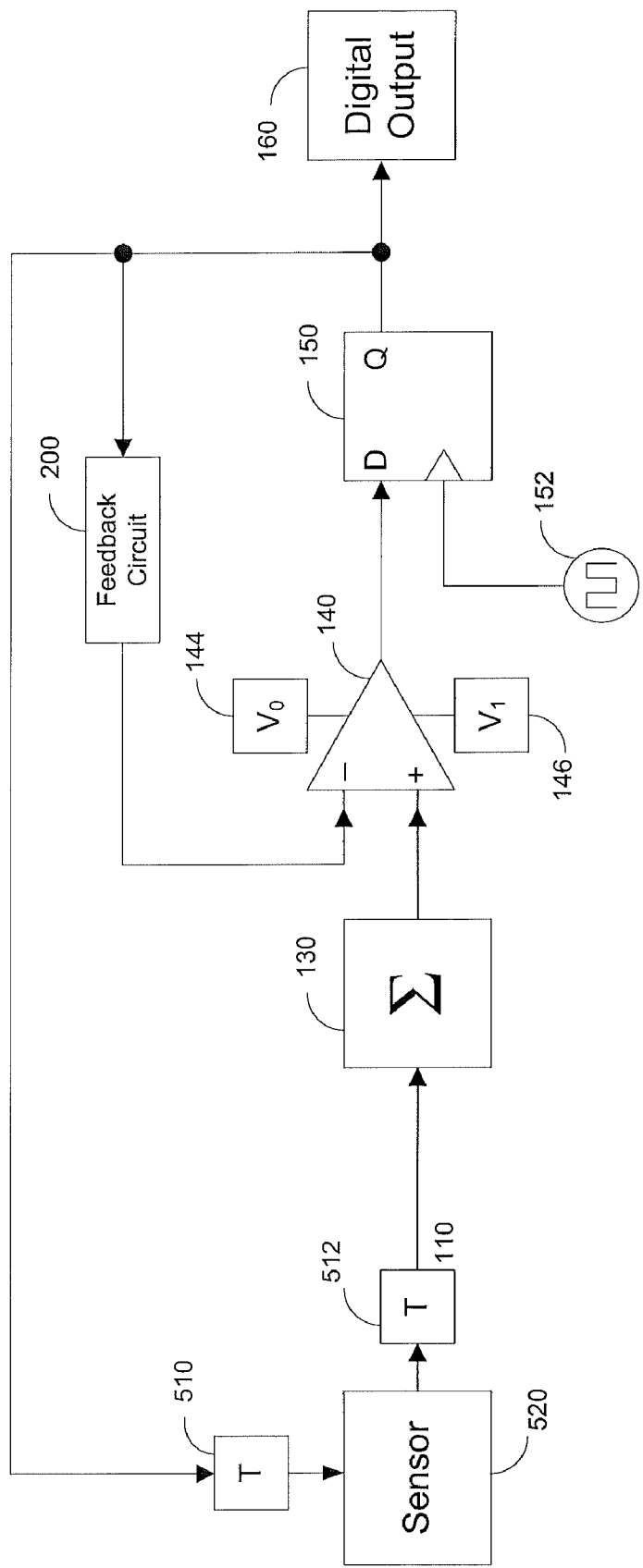
FIG. 5 is a schematic block diagram of a sensor system including a mechanical sensor and a delta-sigma modulator, in accordance with an exemplary embodiment of the present invention.

FIG. 5 is a schematic block diagram of a sensor system including a mechanical sensor 520 (e.g., a micromachined accelerometer or gyroscope or pressure sensor) coupled to the delta-sigma modulator of FIG. 2 via transducers 510 and 512. The transducer 512 performs a mechanical-to-electrical conversion to produce analog signals 110 from mechanical movements of a component of the sensor 520. For example, the transducer 512 may include one or more fixed sensing electrodes that are capacitively coupled with one or more corresponding electrodes on a movable mass and may be used to sense motion of the mass. The transducer 510 is coupled to the digital output 160 and performs an electrical-to-mechanical conversion, e.g., to adjust operation of one or more mechanical components of the sensor 520. For example, the transducer 510 may include one or more fixed drive electrodes that are capacitively coupled with one or more corresponding electrodes on a movable mass and may be used to impart forces to the mass. It should be noted that the transducers 510, 512 may be integral with the sensor 520 or may be separate elements.

When sensor 520 is a vibratory gyro, transducer 510 may incorporate a modulator at the shuttle frequency and transducer 512 may incorporate a corresponding demodulator. In that case, clock 152 has a period that is at least a given multiple of the resonance period. Clock 152 is then advantageously a sub-harmonic of the shuttle frequency such that the modulator applies whole cycles of shuttle excitation for each feedback quantum and avoids residual forces which induce erroneous perturbations to the mechanical motion. In the embodiment shown in FIG. 5, the mechanical structure essentially provides the "delta" function and the transducer block 510 essentially provides the D/A function when used in a force-feedback configuration so that the sensor lag is in the delta-sigma loop; thus, the difference element 120 and the D/A element 170 are omitted.

Figure 6:
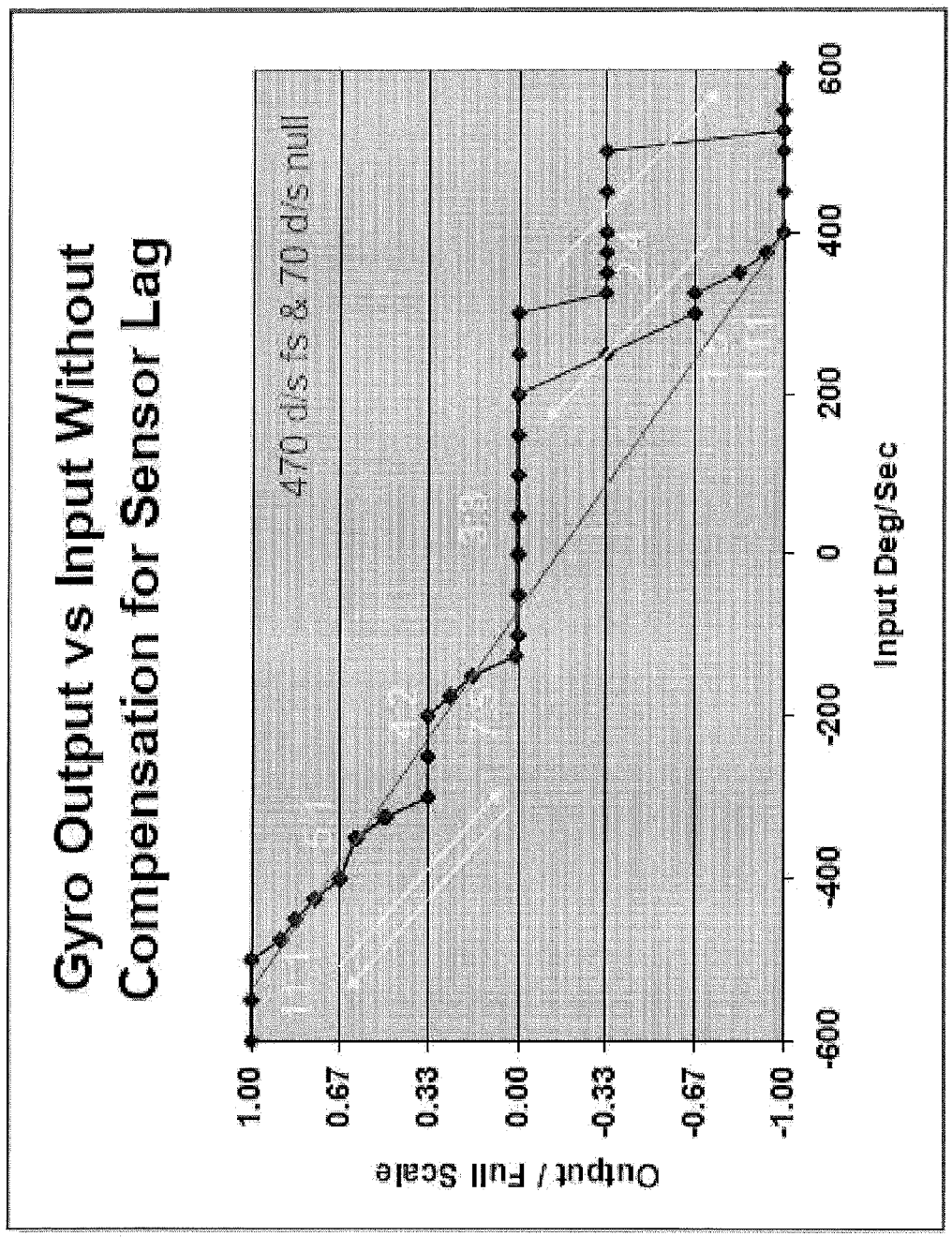
FIG. 6 is a graph of experimental output data from a gyroscope incorporating a delta-sigma modulator known in the art.

FIG. 6 is a graph of experimental output data from a gyroscope incorporating a delta-sigma circuit known in the art. This graph was generated from test data taken from observations of a gyroscopic sensor that does not compensate for sensor lag. The horizontal axis represents the number of degrees per second of angular velocity measured by the gyro, as the input signal. The vertical axis represents the output signal as a fraction of the maximum output signal (i.e., the fraction of the full scale signal). The sensor measured angular motion in degrees per second (deg/sec). Rotation was measured relative to a 'null' rotation of 70 deg/sec, which can be seen as the center of the 0.00 output signal data. The maximum output signal (full scale) of the sensor is reached at 470 deg/sec in either rotational direction. This corresponds to +400 deg/sec and −540 deg/sec input signal, as the experimental data in the figure show at the −1.00 and +1.00 output signal levels, respectively.

Lock bands can be clearly seen in the figure every ⅓ of the full scale output signal, from full scale in one direction to full scale in the other. Any input signal in a lock band will yield the same output signal, so the lock band represents a range of inputs to which the output is insensitive. For example, the lock band at output 0.00 output contains 10 data points, and extends from −125 deg/sec input to +300 deg/sec input. In an ideal sensor, these lock bands should not exist. Instead, the output should be exactly proportional to the input, and the output data points should lie in a straight line.

Figure 7:
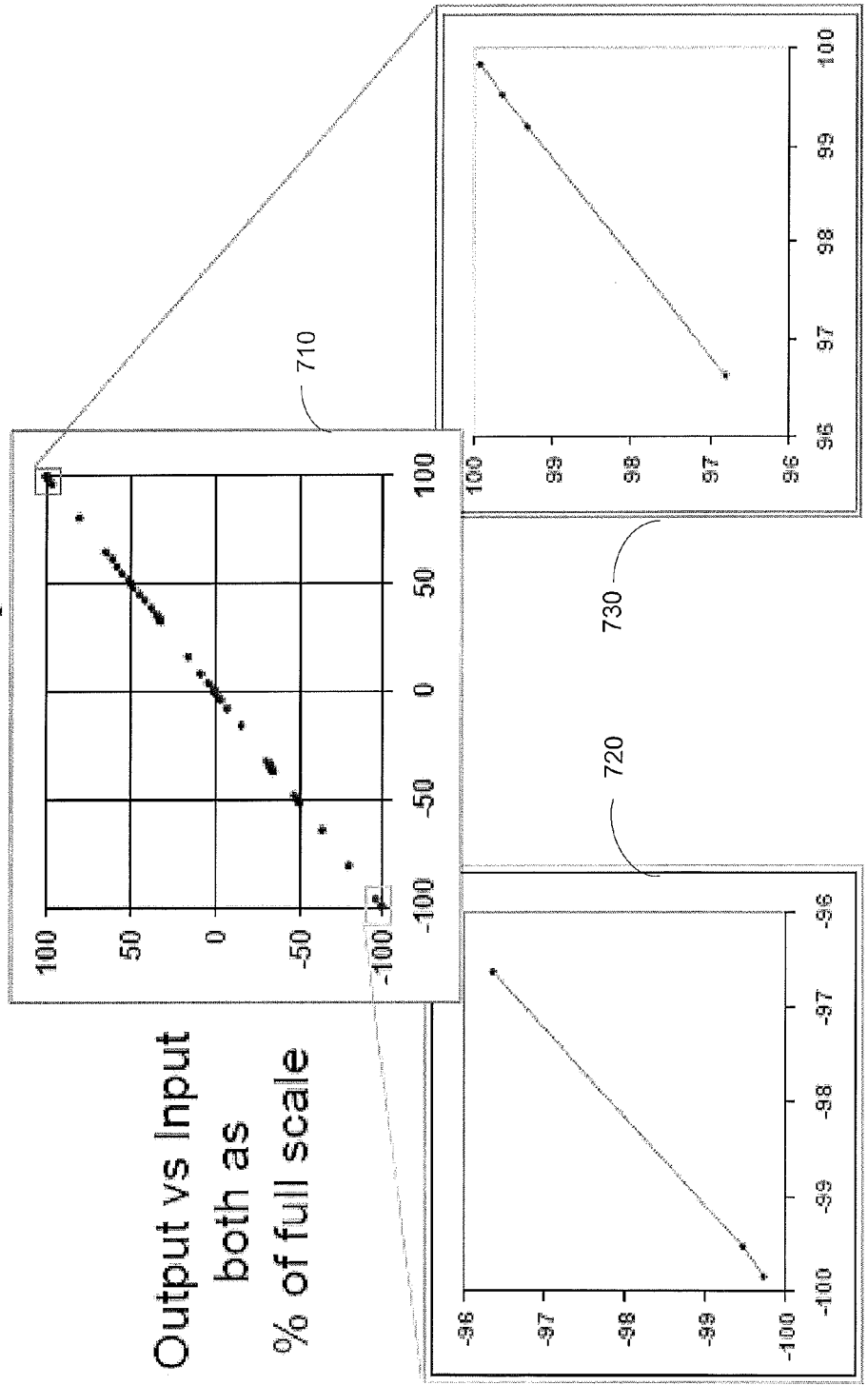
FIG. 7 is a set of graphs of experimental output data from the gyroscope of FIG. 6 after incorporating a delta-sigma circuit in accordance with embodiments of the present invention.

FIG. 7 is a set of graphs of experimental output data from the gyroscope of FIG. 6 after incorporating a delta-sigma circuit in accordance with embodiments of the present invention. Graph 710 shows the linearity between the input and output data over the full range of inputs. Here, clusters of measurements were performed near 0%, 50%, and 100% of full scale input in both rotational directions. As can be seen in the figure, the output closely tracks the full scale input. Lock bands are absent. Graphs 720, 730 show the relationship between the input and output signals near negative and positive full scale inputs, respectively. Both show strong linearity in signal. There are no lock bands, even over changes in the input speed that are fractions of one percent of the input range.

Figure 8:
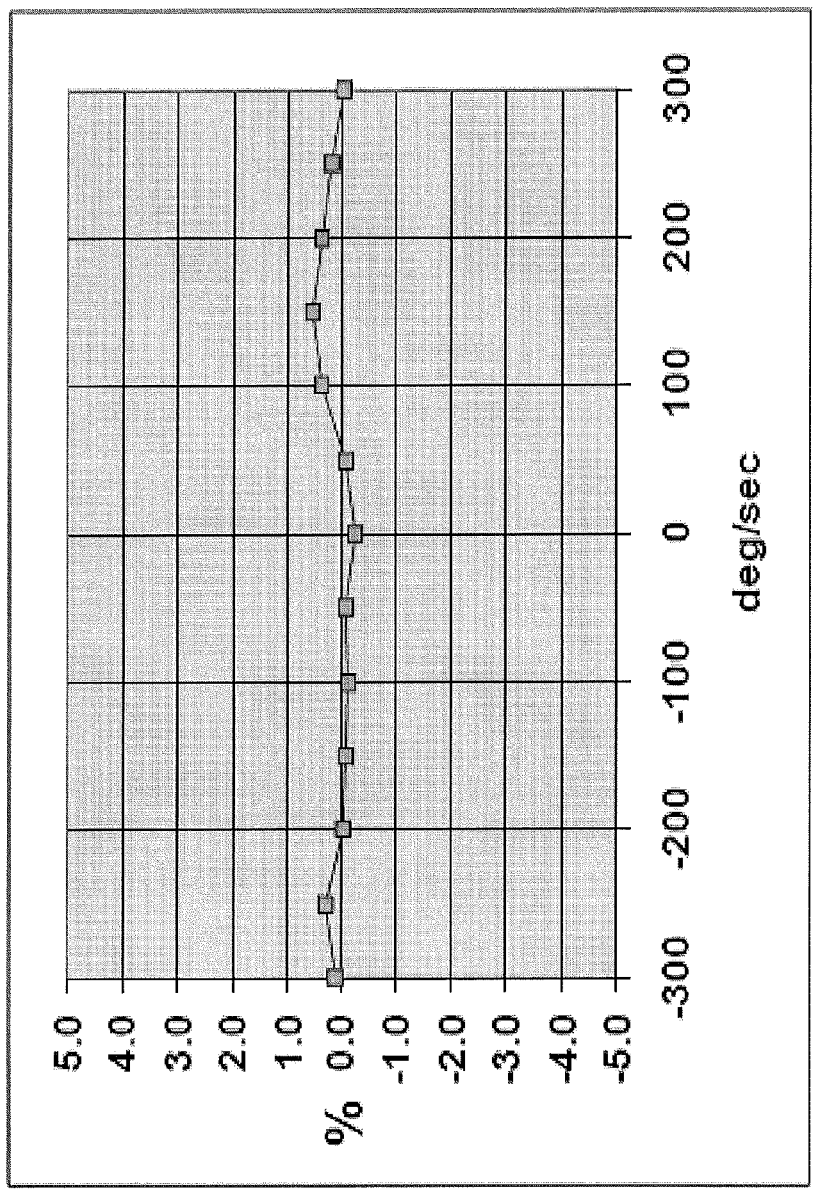
FIG. 8 shows the measured non-linearity error percent as a function of input speed for the gyroscope data of FIG. 7.

FIG. 8 shows the measured non-linearity error percent as a function of input speed for the gyroscope data of FIG. 7. This measured error is the relative magnitude of the deviation between the observed output and a best fit line for the data in FIG. 7. As can be seen from the data in FIG. 8, the observed output does not deviate from the ideal, linear sensor output by more than 0.5% over the entire input range. As an example, look at the worst deviation of 0.5%, which occurs at +150 deg/sec of input speed. When this input speed is presented to the gyro of this embodiment, the output signal will be measured at a value corresponding to a scaled value of between 142.5 deg/sec and 157.5 deg/sec. Compare this to the same sensor of FIG. 6, which is not included in a circuit in accordance with an embodiment of this invention, in which an input speed of +150 deg/sec would register as 0.00 output signal, or 0 deg/sec. At 300 deg/sec input, the error in the present embodiment is approximately 0.0%, and the sensor registers as 300 deg/sec. At 300 deg/sec input, the prior art sensor output would register one-third of full scale. As full scale is 470 deg/sec for that sensor, the output would correspond to about 156 deg/sec, an error of nearly 50%. Even if the output were measured in the 'best' lock band for this input (the lock band at two-thirds full scale), such a reading would correspond to about 312 deg/sec, an error of 4%. This error is still nearly an order of magnitude larger than the worst error measured in the sensor output signal after application of design principles according to the invention taught herein.

The present invention may be embodied in many different forms, including, but in no way limited to, programmable logic for use with a programmable logic device (e.g., a Field Programmable Gate Array (FPGA) or other PLD), discrete components, integrated circuitry (e.g., an Application Specific Integrated Circuit (ASIC)), or other appropriate means including any combination thereof.

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

The embodiments of the invention described above are intended to be merely exemplary; numerous variations and modifications may become apparent to those skilled in the art based on the teachings of this disclosure. All such variations and modifications are intended to be within the scope of the present invention as defined in any appended claims. Any references to the "invention" are intended to refer to exemplary embodiments of the invention and should not be construed to refer to all embodiments of the invention unless the context otherwise requires.

What is claimed is:

1. Apparatus comprising an analog-to-digital converter for converting an analog input signal to a digital output signal, the converter comprising:
   a. a delta circuit configured to produce a delta output signal based on the analog input signal and an analog feedback signal derived from the digital output signal;
   b. a sigma circuit configured to integrate the delta output signal to form a sigma output signal;
   c. a quantizer circuit configured to produce the digital output signal based on the sigma output signal and a reference signal; and d. a feedback circuit configured to modulate the reference signal based on the digital output signal.

2. The apparatus of claim 1, wherein the feedback circuit comprises a transistor.

3. The apparatus of claim 1, wherein the feedback circuit comprises one of a voltage divider and a voltage amplifier.

4. The apparatus of claim 1, wherein the quantizer circuit comprises (i) a comparator having an output and (ii) a digital memory coupled to the comparator output.

5. The apparatus of claim 4, wherein the digital memory comprises a latch.

6. The apparatus of claim 4, wherein the digital memory stores a digital output voltage.

7. The apparatus of claim 1, wherein the delta circuit comprises a digital-to-analog converter for producing the analog feedback signal based on the digital output signal.

8. The apparatus of claim 7, further comprising a microelectromechanical sensor having a mechanical-to-electrical transducer for providing the analog input signal to the analog-to-digital converter based on mechanical operation of the sensor.

9. The apparatus of claim 8, wherein the sensor is one of: a gyroscope, an accelerometer, and a pressure sensor.

10. The apparatus of claim 8, further comprising an electrical-to-mechanical transducer for producing a mechanical effect on the sensor based on the digital output signal.

11. A method for dithering an analog-to-digital converter apparatus, the apparatus including a quantizer for comparing a quantizer input voltage to a reference voltage, the quantizer having an output voltage, the method comprising:

a. storing the quantizer output voltage in a digital memory; and b. varying the reference voltage based on the stored output voltage.

12. The method of claim 11, wherein storing the output voltage includes providing the output voltage to a latch.

13. The method of claim 11, wherein storing the output voltage includes converting the output voltage substantially into one of two given voltages.

14. The method of claim 13, wherein the reference voltage equals the stored output voltage, so that converting the stored output voltage into the reference voltage requires no active or passive circuit elements.

15. The method of claim 11, wherein varying the reference voltage based on the stored output voltage includes applying a constant gain to the stored output voltage.

16. The method of claim 11, wherein analog-to-digital transducer apparatus includes a microelectromechanical sensor having an analog output, the method further comprising determining the quantizer input voltage based on the analog output of the sensor.

17. The method of claim 16, wherein the sensor is one of: a gyroscope, an accelerometer, and a pressure sensor.

18. The method of claim 16, further comprising actuating the sensor in response to a change in the stored output voltage.

19. The method of claim 16, wherein the sensor has a resonance frequency, and varying the reference voltage includes varying the reference voltage according to a clock period that is at least a given multiple of the resonance period.

* * * * *